(12) United States Patent
Yang et al.

(10) Patent No.: US 6,383,939 B1
(45) Date of Patent: May 7, 2002

(54) METHOD FOR ETCHING MEMORY GATE STACK USING THIN RESIST LAYER

(75) Inventors: Wenge Yang, Fremont; Lewis Shen, Cupertino, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/375,504

(22) Filed: Aug. 17, 1999

Related U.S. Application Data

(62) Division of application No. 09/118,377, filed on Jul. 17, 1998.

(51) Int. Cl.[7] .......................................... H01L 21/3065
(52) U.S. Cl. ...................... 438/706; 438/710; 438/712; 438/713; 438/714
(58) Field of Search ................................ 438/706, 710, 438/712, 257, 259, 263, 265, 283, 591, 592, 593

(56) References Cited

U.S. PATENT DOCUMENTS

| | | | |
|---|---|---|---|
| 4,997,518 A | | 3/1991 | Madokoro .................. 156/345 |
| 5,011,782 A | | 4/1991 | Lamb et al. ................ 438/725 |
| 5,445,107 A | * | 8/1995 | Roth et al. ..................... 117/8 |
| 5,731,242 A | * | 3/1998 | Parat et al. .................. 438/586 |
| 5,773,199 A | * | 6/1998 | Linliu et al. ................ 430/316 |
| 5,792,708 A | * | 8/1998 | Zhou et al. .................. 438/647 |
| 5,858,879 A | | 1/1999 | Chao et al. .................. 438/725 |
| 6,143,646 A | * | 11/2000 | Wetzel ........................ 438/637 |

* cited by examiner

Primary Examiner—Felisa Hiteshew
Assistant Examiner—Lan Vinh

(57) ABSTRACT

A memory gate stack in a high density memory core has spaces on the order of less than 0.25 microns using conventional deep ultraviolet (DUV) lithography techniques by depositing a layer of silicon oxynitride over a plurality of layers, and a thin resist layer overlying on the silicon oxynitride layer. The resist layer has a thickness sufficient to withstand removal during etching of the silicon oxynitride layer, for example about 3,000 Angstroms to about 4,000 Angstroms. The silicon oxynitride layer has a sacrificial portion having a thickness at least about 500 Angstroms, and a stop-layer thickness, used for spacer formation following etching of the memory gate, of at least 1,000 Angstroms. The use of silicon oxynitride as an antireflective coating layer in combination with the thin resist optimizes the resolution of DUV lithography, enabling formation of spacers having widths less than about 0.24 microns. In addition, the sacrificial layer of the silicon oxynitride layer enables self-aligned etching of the plurality of layers to form the memory gate stack, while maintaining sufficient thickness for spacer formation.

21 Claims, 2 Drawing Sheets

US 6,383,939 B1

METHOD FOR ETCHING MEMORY GATE STACK USING THIN RESIST LAYER

This application is a divisional of application Ser. No. 09/118,377 filed Jul. 17, 1998.

BACKGROUND OF THE INVENTION

1. Technical Field

The present invention relates to semiconductor devices and manufacturing processes, and more particularly to methods and arrangements associated with a multi-purpose graded silicon oxynitride cap layer in non-volatile memory semiconductor devices.

2. Background Art

A continuing trend in semiconductor technology is to build integrated circuits with more and/or faster semiconductor devices. The drive toward this ultra large-scale integration (ULSI) has resulted in continued shrinking of device and circuit features. As the devices and features shrink, new problems are discovered that require new methods of fabrication and/or new arrangements.

A flash or block erase Electrically Erasable Programmable Read Only Memory (flash EEPROM) semiconductor memory includes an array of memory cells that can be independently programmed and read. The size of each memory cell, and therefore the memory array, is made small by omitting select transistors that would enable the cells to be erased independently. The array of memory cells is typically aligned along a bit line and a word line and erased together as a block. An example of a memory of this type includes individual metal oxide semiconductor (MOS) memory cells, each of which includes a source, drain, floating gate, and control gate to which various voltages are applied to program the cell with a binary 1 or 0. Each memory cell can be read by addressing it via the appropriate word and bit lines.

An exemplary memory cell 8 is depicted in FIG. 1A, viewed in a cross-section through the bit line. Memory cell 8 includes a doped substrate 12 having a top surface 11, and a source 13a and a drain 13b formed by selectively doping regions of substrate 12. A tunnel oxide 15 separates a floating gate 16 from substrate 12. An interpoly dielectric 24 separates floating gate 16 from a control gate 26. Floating gate 16 and control gate 26 are each electrically conductive and typically formed of polysilicon.

On top of control gate 26 is a silicide layer 28, which acts to increase the electrical conductivity of control gate 26. Silicide layer 28 is typically a tungsten silicide (e.g., $WSi_2$), that is formed on top of control gate 26 prior to patterning, using conventional deposition and annealing processes.

As known to those skilled in the art, memory cell 8 can be programmed, for example, by applying an appropriate programming voltage to control gate 26. Similarly, memory cell 8 can be erased, for example, by applying an appropriate erasure voltage to source 13a. When programmed, floating gate 16 will have a charge corresponding to either a binary 1 or 0. By way of example, floating gate 16 can be programmed to a binary 1 by applying a programming voltage to control gate 26, which causes an electrical charge to build up on floating gate 16. If floating gate 16 does not contain a threshold level of electrical charge, then floating gate 16 represents a binary 0. During erasure, the charge is removed from floating gate 16 by way of the erasure voltage applied to source 13a.

FIG. 1B depicts a cross-section of several adjacent memory cells from the perspective of a cross-section through the word line (i.e., from perspective A, as referenced in FIG. 1A). In FIG. 1B, the cross-section reveals that individual memory cells are separated by isolating regions of silicon dioxide formed on substrate 12. For example, FIG. 1B shows a portion of a floating gate 16a associated with a first memory cell, a floating gate 16b associated with a second memory cell, and a floating gate 16c associated with a third memory cell. Floating gate 16a is physically separated and electrically isolated from floating gate 16b by a field oxide (FOX) 14a. Floating gate 16b is separated from floating gate 16c by a field oxide 14b. Floating gates 16a, 16b, and 16c are typically formed by selectively patterning a single conformal layer of polysilicon that was deposited over the exposed portions of substrate 12, tunnel oxide 15, and field oxides 14a and 14b. Interpoly dielectric layer 24 has been conformally deposited over the exposed portions of floating gates 16a, 16b, and 16c and field oxides 14a and 14b. Interpoly dielectric layer 24 isolates floating gates 16a, 16b and 16c from the next conformal layer which is typically a polysilicon layer that is patterned (e.g., along the bit line) to form control gate 26. Interpoly dielectric layer 24 typically includes a plurality of films, such as, for example, a bottom film of silicon, dioxide, a middle film of silicon nitride, and a top film of silicon dioxide. This type of interpoly dielectric layer is commonly referred to as an oxide-nitride-oxide (ONO) layer.

The continued shrinking of memory cells, and in particular the basic functions depicted in the memory cells of FIGS. 1A and 1B, places a substantial burden on the fabrication process to deposit and subsequently pattern a layer stack to form a floating gate-control gate structure, without causing adverse effects within the resulting memory cells. Of particular concern, is the limited resolution encountered during photolithography. In particular, the memory gate stack, illustrated in FIG. 1A, uses conventional photolithography techniques that typically require a resist thickness of typically 8,000 to 9,000 Angstroms. In addition, the thickness of the resist mask is reduced during etching of the layer stack including layers 28, 26, 24, and 16. Hence, the relatively thick layer of photoresist is necessary in order to ensure that the resist mask pattern is preserved during etching of the layer stack.

Use of a mask pattern having a resist thickness of 8,000 to 9,000 Angstroms, however, substantially limits the resolution of the conventional deep ultraviolet (DUV) lithography techniques. Specifically, although DUV lithography may be used to form a gate having a width of around 0.25 microns, the depth of the resist of about 8,000 to 9,000 Angstroms limits the depth of field resolution during resist patterning, such that the spaces between the resist line are a minimum width of about 0.3 microns. Hence, the ability to increase the density of memory cells in a memory array by reducing the spacing between memory gates is limited by conventional DUV photolithography techniques.

SUMMARY OF THE INVENTION

There is a need for increasing the density of a memory gate structure in a deep submicron memory core using conventional DUV lithography techniques.

There is also a need for an arrangement for reducing the spacing in resist mask patterns used to form memory gate structures by reducing the mask thickness, without loss of the mask pattern during etching of the memory gate stack.

These and other needs are attained by the present invention, where a resist mask is formed on an antireflective coating layer and has a resist thickness sufficient to withstand removal during etching of the antireflective coating layer. The antireflective coating layer has a sufficient thickness to include a sacrificial thickness portion, sufficient to withstand removal during etching of the stacked layers on the semiconductor wafer, and also including a stop-layer thickness sufficient for memory gate spacer formation. The increase in thickness of the antireflective coating layer to include a sacrificial thickness enables formation of a resist mask to have a thickness sufficient to withstand removal during etching of the deposited antireflective coating layer. Once the antireflective coating layer has been etched based on the resist mask, the etched antireflective coating layer may be used as a mask for self-aligned etching of the remaining layers. Moreover, addition of the sacrificial thickness in the antireflective coating layer enables the antireflective coating layer to have a sufficient stop-layer thickness, following etching, sufficient for memory gate spacer formation during subsequent processing.

According to one aspect of the present invention, a method of forming a mask for etching of a semiconductor wafer comprises depositing an antireflective coating layer overlying at least a portion of the semiconductor wafer, having a substrate and a plurality of layers overlying the substrate, to a thickness including a stop-layer thickness sufficient for memory gate spacer formation and a sacrificial thickness, and forming a resist mask overlying on the antireflective coating layer and having a thickness sufficient to withstand removal during etching of the deposited antireflective coating layer, wherein the sacrificial thickness is sufficient to withstand removal during etching of the plurality of layers following the etching of the deposited antireflective coating layer.

Another aspect of the present invention provides a method of etching a semiconductor wafer comprising depositing an antireflective coating layer overlying at least a portion of the semiconductor wafer, having a substrate and a plurality of layers overlying the substrate, to a thickness including a stop-layer thickness sufficient for memory gate spacer formation and a sacrificial thickness, and forming a resist mask overlying on the antireflective coating layer and having a thickness sufficient to withstand removal during etching of the deposited antireflective coating layer, etching the antireflective coating layer based on the resist mask to form an antireflective coating layer mask, and etching at least a group of the layers overlying the substrate based on the antireflective coating layer mask to expose a lower layer underlying the group of the layers, and using a remaining portion of the antireflective coating layer mask, including at least the stop-layer thickness, after the etching of the group of the layers as a stop layer for formation of spacers.

Hence, the ability to use a resist mask having a reduced thickness that is sufficient to withstand removal during etching of the deposited antireflective coating layer, followed by etching the group of layers based on the antireflective coating layer mask enables an improved resolution during photolithography techniques, enabling the spacing between mask resist lines to be substantially reduced.

Additional objects, advantages and novel features of the invention will be set forth in part in the description which follows, and in part may become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

Reference is made to the attached drawings, wherein elements having the same reference numeral designations represent like elements throughout and wherein.

BEST MODE FOR CARRYING OUT THE INVENTION

Figure 1A:
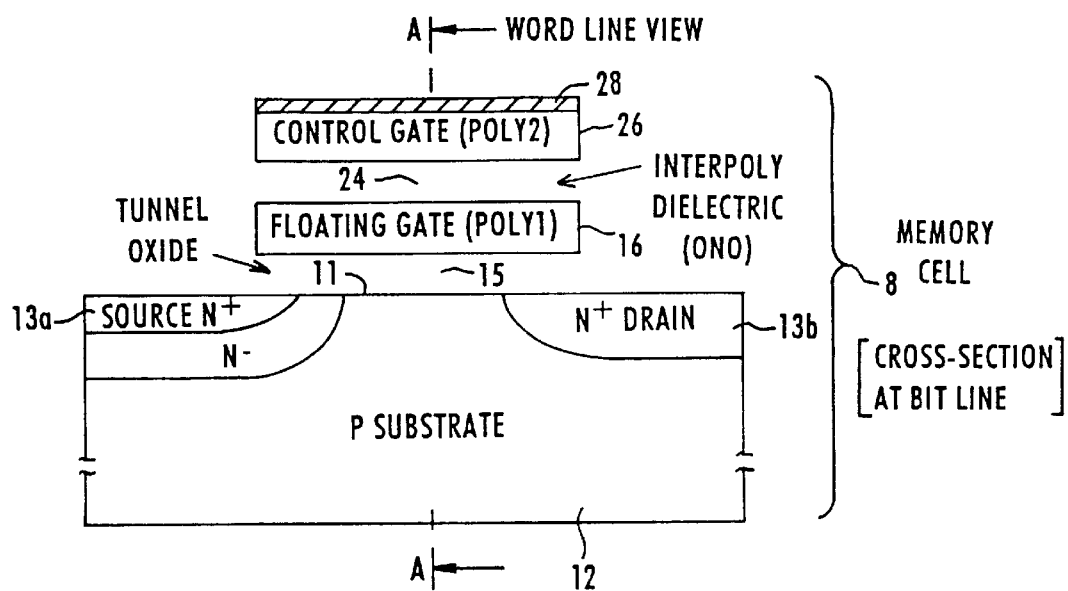
FIGS. 1A and 1B are diagrams illustrating cross-sectional views of a portion of a typical prior art semiconductor device having at least one memory cell, viewed at the bit-line and word-line, respectively.
Figure 1B:
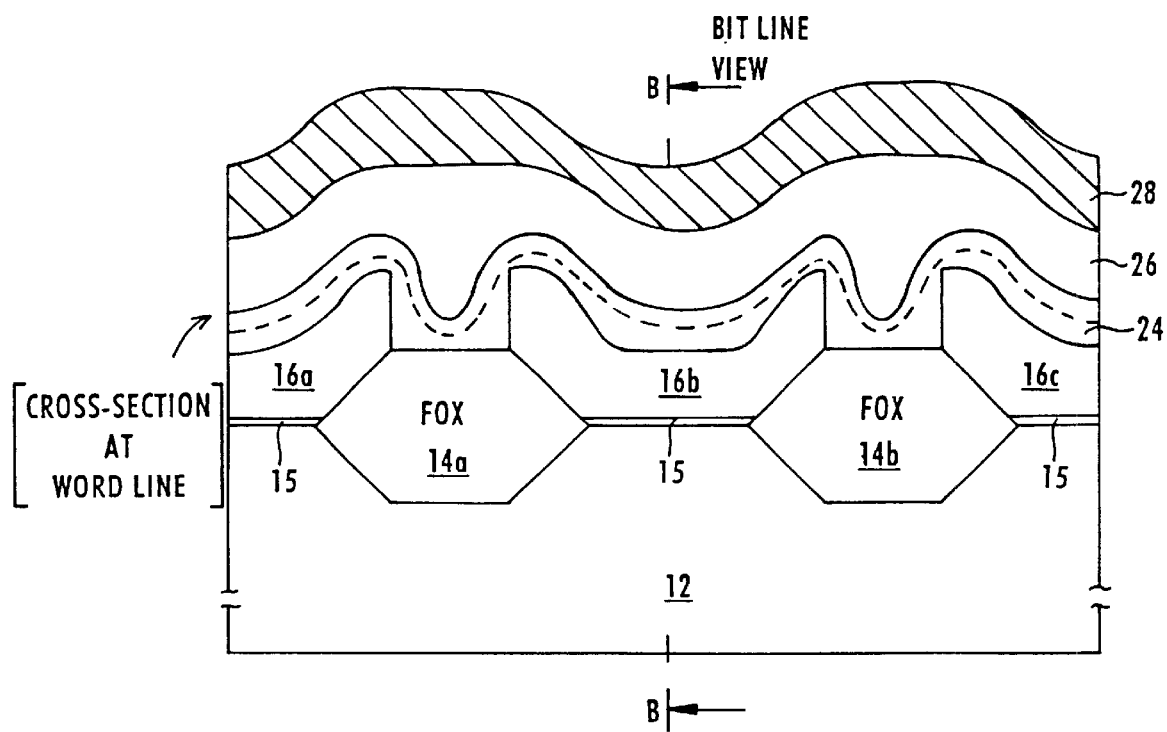
Figure 2A:
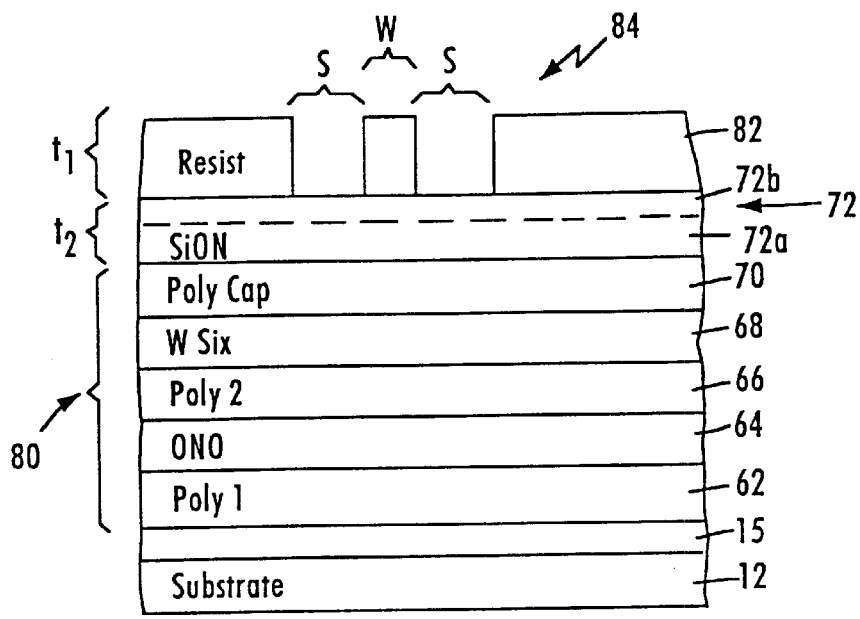
FIGS. 2A, 2B, and 2C are diagrams summarizing a method for forming a memory gate stack using a thin resist layer according to an embodiment of the present invention.
Figure 2B:
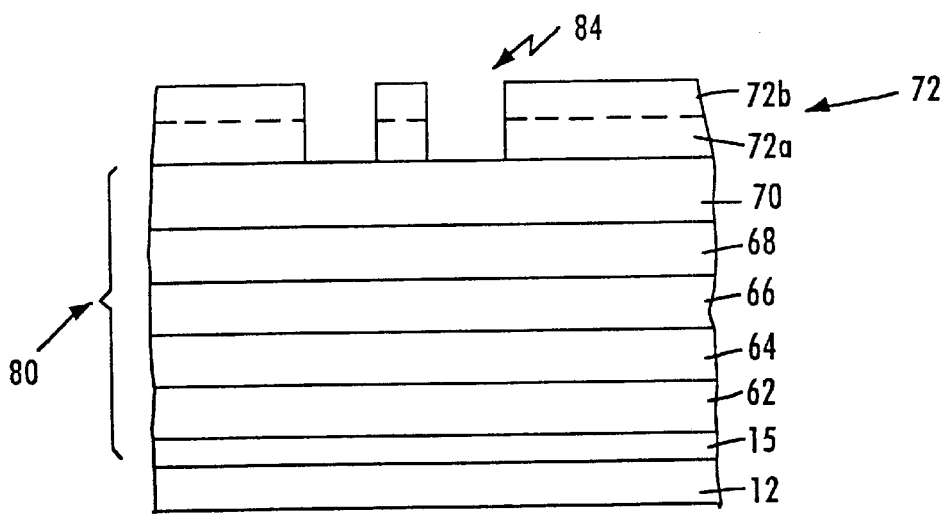
Figure 2C:
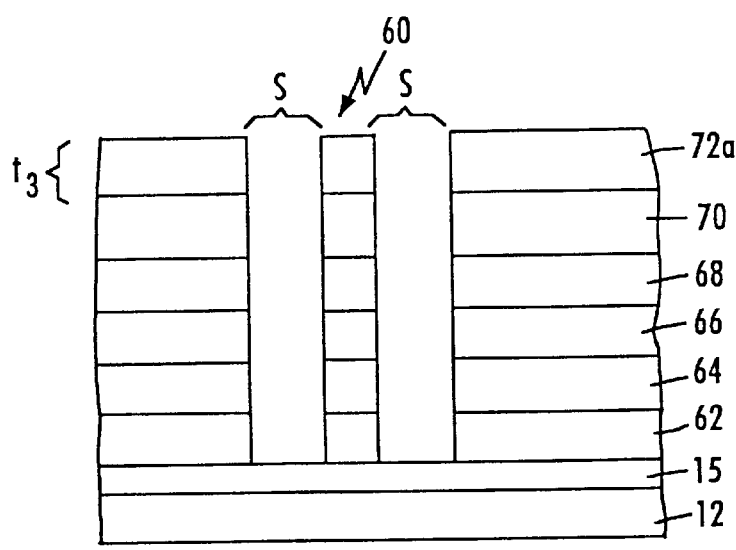

FIGS. 2A, 2B and 2C summarize a method of etching a semiconductor wafer for formation of a memory gate stack 60 according to an embodiment of the present invention. As shown in FIG. 2A a plurality of layers 80 are first formed overlying the substrate 12. The layers 60 include a tunnel oxide layer 15 overlying on the silicon substrate 12, a first polysilicon layer 62 overlying on the tunnel oxide layer 15, and an oxide-nitride-oxide (ONO) layer 64 overlying on the first polysilicon layer 62. The stack 60 also includes a second polysilicon layer 66 overlying on the ONO layer 64, a silicide ($WSi_x$) layer overlying on the second polysilicon layer 66, a polysilicon cap layer 70 overlying on the silicide layer 68, and a silicon oxynitride (SiON) layer 72 overlying on the polysilicon cap layer 70. The silicon oxynitride layer 72 serves as an antireflective coding (ARC) layer, and hence may be used for many reduced-size critical dimension semiconductor devices. Both the polysilicon cap layer 70 and the silicon oxynitride layer 72 are deposited using conventional chemical vapor deposition (CVD) or plasma enhanced chemical vapor deposition (PECVD) techniques. The polysilicon cap layer 70 typically includes undoped polysilicon and has a thickness of about 500 Angstroms. The silicon oxynitride layer includes silicon oxynitride (e.g., $SiO_x, N_y$), (wherein x and y represent the atomic percentage of oxygen and nitrogen, respectively) and has a thickness of about 400 Angstroms.

The layer stack 60 is configured for submicron memory gates, and has a height of between about 3,500 Angstroms to about 5,000 Angstroms. The tunnel oxide layer 15 is about 50 Angstroms thick, and is thermally grown on substrate 12. The polysilicon layer 62 is a doped polysilicon layer formed on the tunnel oxide 15 using conventional CVD or PECVD techniques to a thickness of about 900 to about 1,100 Angstroms, and is used in the memory gate as the floating polysilicon gate. The interpoly dielectric layer (ONO) 64 is then formed overlying on the polysilicon layer 62 using conventional deposition techniques to a thickness of about 150 to 200 Angstroms total. As recognized in the art, the ONO layer 64 may be formed by a three-stage process including forming a first film of silicon dioxide on the polysilicon layer 62, depositing a film of silicon nitride on the silicon dioxide, and then depositing a second film of silicon dioxide on the silicon nitride film.

The polysilicon layer 66 is then deposited on the ONO layer 64 to a thickness of about 1,200 Angstroms. The silicide layer 68 is then formed using conventional silicide forming techniques to a thickness of about 1,100 to 1,700 Angstroms. The poly cap layer 70 is then formed to a thickness of about 500 Angstroms.

The silicon oxynitride layer is then deposited overlying on the poly cap layer 70. Although the preferred embodiment uses silicon oxynitride as the antireflective coating layer 72, alternative cap layer materials may be used that include a controllable atomic percentage of nitrogen, for example, silicon oxime.

According to the disclosed embodiment, the silicon oxynitride layer 72 has a thickness $t_2$ that includes a stop-layer thickness 72a of about 1,000 Angstroms and a sacrificial layer thickness 72b of about 500 Angstroms to 1,500 Angstroms, depending on the thickness of the plurality of layers 80.

A resist layer 82 is then deposited overlying on the antireflective coating layer 72 to a maximum thickness ($t_1$) of about 4,000 Angstroms, and having a range of about 3,000 Angstroms to about 4,000 Angstroms. Hence, use of the relatively thin resist layer 82 and the ARC layer 72, enables formation of a resist mask 84 having resist lines having a width (W) less than about 0.25 microns, and spaces (S) between the resist lines less than about 0.25 microns. The relatively thin resist layer 82 thus enables the density of memory gates to be increased by reducing the spacing S between memory gates. As described below, the thickness $t_1$ of the resist is sufficient to withstand removal during etching of the deposited antireflective coating layer. In other words, the thickness $t_1$ of the resist layer 82 only needs to have a sufficient thickness to retain the pattern of the mask 84 during etching of the SiON layer 72.

Following etching of the SiON layer 72, as shown in FIG. 2B, the pattern 84 of the resist mask is transferred to the antireflective coating layer 72. Although the resist layer 82 may be removed by the time the ARC layer 72 is completely etched, formation of the pattern 84 in the layer 72 enables the ARC layer 72 to act as a mask to perform self-aligned etching of the layers 80. According to the disclosed embodiment, the sacrificial layer 72b has a sufficient thickness to ensure that sufficient thickness remains in the stop-layer thickness for memory gate spacer formation at the completion of forming the memory gate stack 60.

As shown in FIG. 2C, self-aligned etching of the stack 80 using the antireflective coating layer 72 results in the formation of the layer stack 60 having spaces S on each side less than about 0.25 microns, where the stop-layer thickness 72a has a sufficient thickness ($t_3$) for the formation of memory gate spacers.

Hence, the disclosed embodiment enables the density of memory gate structures to be improved by reducing the spacing in between memory gates, while using conventional DUV photolithography techniques. Moreover, the addition of a sacrificial thickness 72a in the antireflective coating layer ensures that the self-aligned etching does not adversely affect use of the remaining antireflective coating 72a for memory gate spacer formation.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit device during fabrication are not drawn to scale, but instead are drawn to illustrate the features of the present invention.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a mask for etching a memory cell gate stack formed over a surface of a semiconductor wafer, the method comprising:

depositing an antireflective coating layer over the gate stack, to a thickness including a stop-layer thickness sufficient for spacer formation and a sacrificial thickness; and forming a resist mask overlying on the antireflective coating layer and having a thickness up to about 4,000 Angstroms, wherein the stop layer thickness is sufficient to withstand removal during etching of the gate stack following the etching of the deposited antireflective coating layer, and wherein the gate stack comprises two doped polysilicon layers separated by a dielectric layer.

2. The method of claim 1, wherein the step of forming the resist mask includes depositing resist to a maximum thickness enabling formation of resist lines having a width of less than about 0.25 microns, and spaces between the resist lines less than about 0.25 microns.

3. The method of claim 2, wherein the step of depositing an antireflective coating layer includes depositing to a thickness of about 1500 Angstroms to about 2500 Angstroms.

4. The method of claim 3, wherein the stop-layer thickness is at least about 1000 Angstroms and the sacrificial thickness is at least about 500 Angstroms.

5. The method of claim 2, wherein the step of depositing an antireflective coating layer further includes depositing silicon oxynitride as the antireflective coating.

6. The method of claim 1, wherein the gate stack comprises:

a tunnel oxide on the semiconductor wafer surface;

a first doped polysilicon layer on the tunnel oxide;

a dielectric layer on the first doped polysilicon layer;

a second doped polysilicon layer on the dielectric layer;

a metal silicide layer on the second doped polysilicon layer; and an undoped polysilicon cap layer on the metal silicide layer.

7. The method of claim 6, wherein the step of forming the resist mask further includes:

depositing the resist layer to the thickness of about 3000 Angstroms to about 4000 Angstroms; and patterning the resist layer using deep ultraviolet lithography to form the resist mask.

8. The method of claim 7, wherein the patterning step includes forming resist lines having a width less than about 0.25 microns, and spaces between the resist lines less than about 0.25 microns.

9. The method of claim 6, wherein the step of forming the resist mask further includes forming resist lines having a width less than about 0.25 microns, and spaces between the resist lines less than about 0.25 microns.

10. The method of claim 7, wherein the step of depositing an antireflective coating layer includes depositing to a thickness of about 1500 Angstroms to about 2500 Angstroms.

11. The method of claim 10, wherein the stop-layer thickness is at least about 1000 Angstroms and the sacrificial thickness is at least about 500 Angstroms.

12. A method of etching a memory cell gate stack overlying a surface of a semiconductor wafer, the method comprising:

depositing an antireflective coating layer overlying the gate stack to a thickness including a stop-layer thickness sufficient for memory gate spacer formation and a sacrificial thickness; and forming a resist mask over the antireflective coating layer and having a thickness up to about 4000 Angstroms;

etching the antireflective coating layer using the resist mask to form an antireflective coating layer mask;

etching at least part of the gate stack using the antireflective coating layer mask; and forming sidewall spacers on side surfaces of the gate stack using at least the stop-layer of the antireflective coating as a mask.

13. The method according to claim 12, wherein the gate stack comprises:

a tunnel oxide formed on the semiconductor wafer surface;

a first doped polysilicon layer on the tunnel oxide;

a dielectric layer on the first doped polysilicon layer;

a second doped polysilicon layer on the dielectric layer;

a metal silicide layer on the second doped polysilicon layer; and an undoped polysilicon cap layer on the metal silicon layer.

14. The method of claim 12, wherein the stop-layer thickness is sufficient to withstand removal during etching of the gate stack.

15. The method of claim 14, wherein the step of forming the resist mask includes depositing a resist layer to a thickness having a range of about 3000 Angstroms to about 4000 Angstroms.

16. The method of claim 15, wherein the step of forming the resist mask includes using deep ultraviolet lithography to form resist lines having a width less than about 0.25 microns, and spaces between the resist lines less than about 0.25 microns.

17. The method of claim 15, wherein the step of depositing an antireflective coating layer includes depositing to a thickness of about 1500 Angstroms to about 2500 Angstroms.

18. The method of claim 17, wherein the step of depositing an antireflective coating layer includes depositing silicon oxynitride as the antireflective coating.

19. A method of etching a memory cell gate stack overlying a surface of a semiconductor wafer, the method comprising:

depositing an antireflective coating layer overlying at least a portion of the semiconductor wafer, having a substrate and a plurality of layers overlying the substrate, to a thickness including a stop-layer thickness sufficient for memory gate spacer formation and a sacrificial thickness;

forming a resist mask overlying on the antireflective coating layer and having a thickness sufficient to withstand removal during etching of the deposited antireflective coating layer;

etching the antireflective coating layer based on the resist mask to form an antireflective coating layer mask;

etching at least a group of the layers overlying the substrate based on the antireflective coating layer mask to expose a lower layer underlying the group of the layers; and using a remaining portion of the antireflective coating layer mask, including at least the stop-layer thickness, after the etching of the group of the layers as a stop layer for formation of spacers, wherein the group of the layers includes a first polysilicon layer, a dielectric layer overlying on the first polysilicon layer, a second polysilicon layer overlying on the dielectric layer, a silicide layer on the second polysilicon layer, and a third polysilicon layer on the silicide layer, the step of etching the group of layers comprising etching each of the layers using the antireflective coating layer mask comprising forming the resist mask.

20. The method of claim 19, comprising forming the resist mask at a thickness up to about 4,000 Angstroms.

21. The method according to claim 20, comprising forming the resist mask at a thickness of about 3,000 Angstroms to about 4000 Angstroms.

* * * * *

UNITED STATES PATENT AND TRADEMARK OFFICE
CERTIFICATE OF CORRECTION

PATENT NO. : 6,383,939 B1  
DATED : May 7, 2002  
INVENTOR(S) : Wenge Yang et al.

It is certified that error appears in the above-identified patent and that said Letters Patent is hereby corrected as shown below:

Column 6,  
Line 25, change "2" to -- 3 --.

Signed and Sealed this

Sixteenth Day of July, 2002

Attest:

Attesting Officer

JAMES E. ROGAN  
Director of the United States Patent and Trademark Office